United States Patent
Adireddy et al.

(10) Patent No.: US 10,720,905 B2
(45) Date of Patent: *Jul. 21, 2020

(54) TRANSMITTERS-BASED LOCALIZATION AT INTERSECTIONS IN URBAN ENVIRONMENTS

(71) Applicant: Continental Automotive Systems, Inc, Auburn Hills, MI (US)

(72) Inventors: Ganesh Adireddy, Bloomfield Hills, MI (US); Javier Alcazar, Royal Oak, MI (US); Dominik Froehlich, Ferndale, MI (US); Ibro Muharemovic, Warren, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/140,072

(22) Filed: Sep. 24, 2018

(65) Prior Publication Data

US 2019/0097610 A1 Mar. 28, 2019

Related U.S. Application Data

(60) Provisional application No. 62/562,032, filed on Sep. 22, 2017.

(51) Int. Cl.
| | | |
|---|---|---|
| *G01C 21/26* | (2006.01) |
| *H03H 21/00* | (2006.01) |
| *G01C 21/16* | (2006.01) |
| *G06F 11/34* | (2006.01) |
| *G01S 1/68* | (2006.01) |
| *G01S 5/14* | (2006.01) |
| *G01S 19/48* | (2010.01) |

(52) U.S. Cl.
CPC ......... *H03H 21/003* (2013.01); *G01C 21/165* (2013.01); *G01S 1/68* (2013.01); *G01S 5/14* (2013.01); *G01S 19/48* (2013.01); *G06F 11/34* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,661,604 | B1* | 5/2017 | O'Shea | H04W 64/00 |
| 2002/0057217 | A1* | 5/2002 | Milnes | G01C 21/28 |
| | | | | 342/357.57 |
| 2003/0071754 | A1* | 4/2003 | McEwan | G01S 5/06 |
| | | | | 342/464 |

(Continued)

*Primary Examiner* — Masud Ahmed (57) ABSTRACT

New measurement inputs for Kalman Filter or similar estimation approaches (at each sample) may include: DSRC messages from roadside transmitters (RSTs), such as: how long it takes for a DSRC signal from one or more fixed RSTs to reach the vehicle and comparison of that information with vehicle position estimates from a signal propagation model, which is based on how long it takes a DSRC signal to reach the vehicle GPS location from a fixed known RST location. From such measurements, it can be determined how much longer (or shorter) it takes to receive the RST message compared to the previous sample, which, in turn, gives an idea how far the vehicle has moved over a sample relative to a fixed RST location.

10 Claims, 6 Drawing Sheets

(56) References Cited

U.S. PATENT DOCUMENTS

| | | | |
|---|---|---|---|
| 2015/0312078 A1* | 10/2015 | Bogdan | H04L 7/0087 375/226 |
| 2016/0033649 A1* | 2/2016 | Mathews | G01S 5/021 342/357.48 |
| 2017/0025008 A1* | 1/2017 | Gignac | G08G 1/143 |
| 2018/0227882 A1* | 8/2018 | Freda | H04W 8/005 |

* cited by examiner

Figure 5 receive a first Dedicated Short Range Communication (DSRC) message from a first Road Side Transmitter (RST) located at an intersection between a plurality of streets, the first DSRC message from the first RST indicating the location of the first RST and when the first DSRC message from the first RST was sent

602 receive a second DSRC message from the first RST, the second DSRC message from the first RST indicating the location of the first RST and when the second DSRC message from the first RST was sent

604 determine a first vehicle delta time between receiving the second DSRC message from the first RST and receiving the first DSRC message from the first RST

606 generate a first calculated distance travelled by the vehicle during the first vehicle delta time by multiplying the first vehicle delta time by a speed at which the vehicle was travelling between receiving the first DSRC message from the first RST and receiving the second DSRC message from the first RST

608 provide the calculated distance to a vehicle-location estimator that uses the calculated distance travelled by the vehicle to generate a location estimate of the vehicle that is more accurate than an estimate generated without using the calculated distance

```
┌─────────────────────────────────────────────────────────────────────┐
│ receive a first Dedicated Short Range Communication (DSRC) message  │
│ from a first RST located at an intersection between a plurality of  │
│ streets, the first DSRC message from the first RST indicating the   │
│ location of the first RST and when the first DSRC message from the  │
│ first RST was sent                                                  │
│                              702                                    │
└─────────────────────────────────────────────────────────────────────┘
                                  │
                                  ▼
┌─────────────────────────────────────────────────────────────────────┐
│ determine a first delta time by determining a difference between a  │
│ vehicle's time of receipt of the first DSRC message from the first  │
│ RST and an RST's time of transmission of the first DSRC message     │
│ from the first RST                                                  │
│                              704                                    │
└─────────────────────────────────────────────────────────────────────┘
                                  │
                                  ▼
┌─────────────────────────────────────────────────────────────────────┐
│   receive a second DSRC message from the first RST, the second DSRC │
│ message from the first RST indicating the location of the first RST │
│ and when the second DSRC message from the first RST was sent        │
│                              706                                    │
└─────────────────────────────────────────────────────────────────────┘
                                  │
                                  ▼
┌─────────────────────────────────────────────────────────────────────┐
│   determine a second delta time by determining a difference between │
│ a vehicle's time of receipt of the second DSRC message from the     │
│ first RST and an RST's time of transmission of the second DSRC      │
│ message from the first RST                                          │
│                              708                                    │
└─────────────────────────────────────────────────────────────────────┘
                                  │
                                  ▼
┌─────────────────────────────────────────────────────────────────────┐
│  determine a first difference of delta time by subtracting the      │
│  first delta time from the second delta time                        │
│                              710                                    │
└─────────────────────────────────────────────────────────────────────┘
                                  │
                                  ▼
┌─────────────────────────────────────────────────────────────────────┐
│ generate a first calculated distance propagated by the DSRC signal  │
│ between receiving the first and second DSRC messages from the first │
│ RST by multiplying the first difference of delta time by the speed  │
│ of light                                                            │
│                              712                                    │
└─────────────────────────────────────────────────────────────────────┘
                                  │
                                  ▼
┌─────────────────────────────────────────────────────────────────────┐
│ provide the calculated distance propagated by the DSRC signal to a  │
│ vehicle-location estimator that uses the calculated distance        │
│ propagated by the DSRC signal to generate a location estimate of    │
│ the vehicle that is more accurate than an estimate generated        │
│ without using the calculated distance propagated by the DSRC signal │
│                              714                                    │
└─────────────────────────────────────────────────────────────────────┘
```

Figure 7

TRANSMITTERS-BASED LOCALIZATION AT INTERSECTIONS IN URBAN ENVIRONMENTS

BACKGROUND

Traditionally for vehicle localization (i.e., for a vehicle to determine its location), inputs from sensors like camera/radar/ultrasonic/lidar are used and transceivers, such as DSRC (Dedicated Short Range Communications), are used for V2V/V2X (Vehicle-to-Vehicle/Vehicle-to-Infrastructure) communication.

Alternatively, to estimate a vehicle's position, vehicle dynamics information has also been used in the past along with GNSS/GPS (Global Navigation Satellite System/Global Positioning System) information. But, in urban environments, the GNSS/GPS signals are weak, thereby negatively effecting the accuracy of position estimation.

Vehicles being able to determine their locations more accurately (with less error) in urban environments would advance the prior art.

BRIEF SUMMARY

Embodiments of the invention are directed to new measurement inputs for Kalman Filter or similar estimation approaches (at each sample), which may include: DSRC messages from roadside transmitters (RSTs), such as: how long it takes for a DSRC signal from one or more fixed RSTs to reach the vehicle and comparison of that information with vehicle position estimates from a signal propagation model, which is based on how long it takes a DSRC signal to reach the vehicle GPS location from a fixed known RST location.

With asynchronous time at the RST and the vehicle, delta time is compared to receive a message from the RST over measurement samples.

With time synchronous between the RST and the vehicle, per sample, a delta time to receive a message at the vehicle can be calculated (time stamp from vehicle–RST).

From such measurements, it can be determined how much longer (or shorter) it takes to receive the RST message compared to the previous sample, which, in turn, gives an idea how far the vehicle has moved over a sample relative to a fixed RST location.

DETAILED DESCRIPTION

In accordance with embodiments of the invention, three or more transceivers (similar to DSRC transceivers) may be placed, separated by some distance, at an intersection of roads or in any other urban setting.

As used in this document, the term "transmitter" is used interchangeably with the term "transceiver" such that when the term "transmitter" is used it may be referring to a transmitter portion of a transceiver. Similarly, the term "receiver" is used interchangeably with the term "transceiver" such that when the term "receiver" is used it may be referring to a receiver portion of a transceiver.

Figure 1:
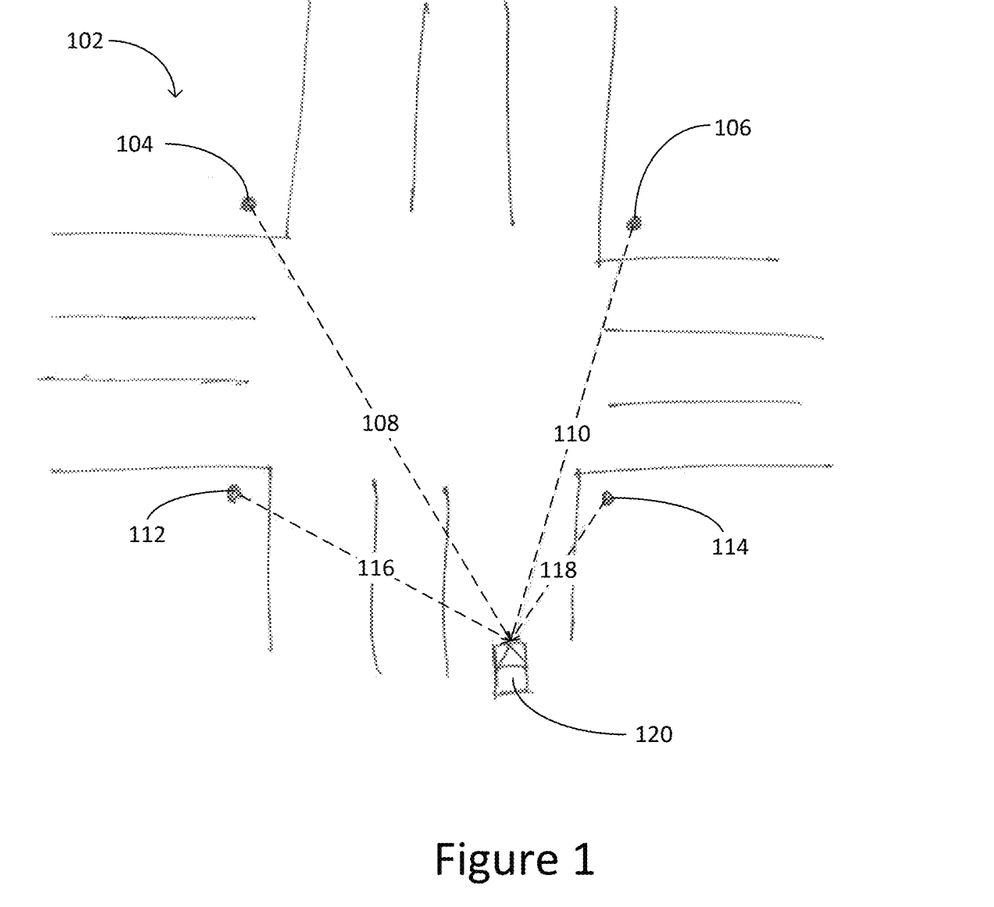
FIG. 1 depicts an intersection of two roads in an urban environment with four stationary transmitters/transceivers in accordance with embodiments of the invention.

FIG. 1 depicts an intersection 102 of two roads in an urban environment with four stationary transmitters/transceivers 104, 106, 112, and 114 in accordance with embodiments of the invention.

The respective locations of each of the transmitters/transceivers positioned at the intersection is known. Each transmitter/transceiver periodically transmits messages, depicted in FIG. 1 as 108, 110, 116, and 118, specifying the transmitter's location (e.g, Latitude, Longitude, and altitude) and a timestamp specifying when the transmitter is transmitting the message (e.g., a high-resolution UTC (Coordinated Universal Time) time stamp). Each message may also include a specific identification number, which may specify, among other things, that the transmitter that sent the message has a fixed location (i.e., it does not move). Such messages may be transmitted every 100 milliseconds, or at any other suitable frequency. The timestamps may specify a transmission time, based on UTC, with a higher resolution than milliseconds. For example, the resolution of the transmission time stamps may be microseconds, nanoseconds, or any other suitable resolution. Generating a clock "tick", and an associated counter value, in the microsecond or nanosecond range is well known in the art and is, therefore, not described further for the sake of brevity.

Vehicles, such as the vehicle 120 shown in FIG. 1, may be equipped with a wireless receiver/transceiver configured to wirelessly receive the messages transmitted by the fixed transmitters/transceivers spaced apart throughout the intersection 102.

Figure 2:
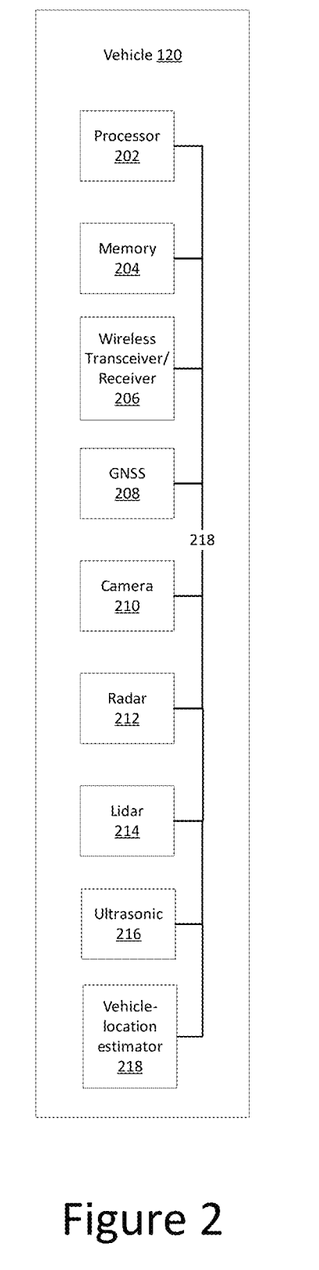
FIG. 2 is a schematic view depicting selected components of the vehicle shown in FIG. 1.

FIG. 2 is a schematic view depicting selected components of the vehicle 120 shown in FIG. 1. The vehicle 120 includes a processor 202, a memory 204, a wireless transceiver/receiver 206, and GNSS/GPS 208, a camera 210, a Radar 212, a Lidar 214, an ultrasonic 216, and a vehicle-location estimator 218, which communicate via a communication bus 218, such as a CAN (Controller Area Network) bus, which is well known in the art.

Figure 3:
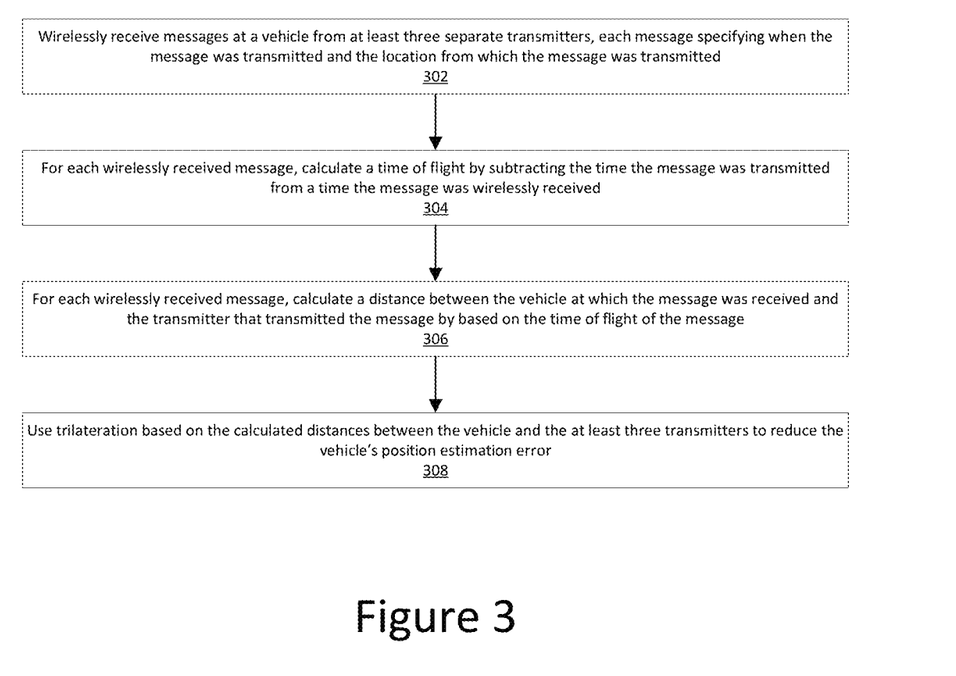
FIG. 3 is a flow chart depicting steps in accordance with embodiments of the invention.

FIG. 3 is a flow chart depicting steps in accordance with embodiments of the invention. As depicted at 302 and 304, upon receiving the messages 108, 110, 116, and 118 from at least three of the spaced-apart transmitters/transceivers 104, 106, 112, and 114, the processor 202 within the vehicle 120 determines when each message was received at the vehicle by the wireless receiver/transceiver. Like the clocks in the transmitters/transceivers, the clock in the vehicle may be high-resolution. And the clock in the vehicle may be synchronized periodically to UTC in a manner that is well known in the art.

For each received message, the processor 202 then calculates the message's time of flight by subtracting the transmission time stamp from the time that the message was received at the vehicle by the wireless transceiver/receiver 206. The processor then calculates a distance between the vehicle and each transmitter based on the speed that RF waves travel through air (approximately 3×10⁸ m/s), the calculated time of flight between each transmitter/transceiver and the vehicle, and the well-known relationship that distance equals rate times time. Trilateration, which is well known in the art, may then be used to localize the vehicle more accurately and/or more quickly and/or to reduce the vehicle's position estimation error based on the calculated distances between the vehicle 120 and the fixed transmitters 104, 106, 112, and 114.

Trilateration results of this type may be used in conjunction with other ways of estimating a vehicle's position including, but no limited to, GNSS/GPS data, dead reckoning, camera data, LIDAR data, RADAR data, ultrasonic data, and the like.

In some embodiments, the DSRC transmitters (also referred to as Roadside Transmitters (RSTs)) broadcast their fixed location in regular intervals (fixed transmission rate) with their own timestamp and ID. This is received in the vehicle using DSRC receiver and a high-resolution clock (nanosecond sample) keeps track of when it received the message. Vehicle in the vicinity of such RST/s, the vehicle will keep receiving messages from RST/s and when the vehicle receives a message, a delta time between receiving the message and receiving a previous message is calculated, for example if RST DSRC transmits its (fixed) position every 100 ms, at sample K, vehicle may receive a message at $T_1$, at sample k+1, the vehicle may get closer to the RST and receive a message at $T_2$. This means the vehicle moved ($T_2-T_1$) (multiplied by the speed that the message travels) closer to the RST, which is at a known location, in 100 ms time. This combined with vehicle's own low-resolution GPS and dynamics information, will result in more accurate vehicle position estimation. However, in the real world, the signal from the RST may not be clean (e.g., it may have some noise or multi-path reflections), which can be dealt with by using similar messages from additional RSTs.

In some embodiments, the clocks in RST are synchronized with other GPS clocks. When used both at the infrastructure (transmitter) and in the vehicle (receiver), the clocks are synchronized at least to a few hundred milliseconds (depending on GPS hardware it can be configurable from 0.25 Hz to 10 MHz). The infrastructure RSTs may transmit, e.g., by DSRC, their location and time stamp at the same time (say every 100 ms). At the receiving end in the vehicle, GPS still updates the time every 100 ms but using that tick, in a processor, a counter may be updated more frequently, such as, every nanosecond or any other suitable time interval. This way the vehicle can know precisely when it receives information from the RSTs, and the vehicle can know the time of flight. For example, if RST DSRC transmits its position every 100 ms, at sample K, the vehicle may receive it at T+15 ns, therefore the time of flight is 15 ns, and, at sample k+1, the vehicle may get closer to the RST and receive at T+10 ns. This means over the 2 samples the vehicle moved closer to the RST with Time of Flight changing from 15 ns to 10 ns. Using the time of flight information with vehicle dynamics and the vehicle's GPS information, a more precise estimation of position can be obtained.

In some embodiments, an RST includes a GPS receiver and a DSRC transmitter. When installing the RST, the GPS location of the unit is known precisely. When operating, the low resolution GPS in the RST may not match the precise mounting location and by comparing them, a GPS error may be calculated. This calculated GPS error may be broadcast from the RST, via DSRC for example, as a GPS correction message, which, when received by the vehicle, may be used to correct the vehicle's position. With multiple RSTs, nearby vehicles may receive multiple GPS corrections to correct their own positions more accurately.

Unlike Differential GPS, these embodiments do not need a base station and does not need to talk to NTRIP to get the correction. The GPS in the RST, which is low resolution, like the one in the vehicle, calculates the GPS position which will have some error. This position from GPS is compared to the hardcoded GPS position at which the RST is installed to calculate the position error. As the GPS is like the one in vehicle, they both have very similar, if not the same, position error. The vehicle may use this position error message from the RST to improve the vehicle's own position estimate. In case the vehicle receives multiple GPS corrections from the RSTs in close proximity to the vehicle, an average of the received corrections may be used by the vehicle.

Radars (77 GHz) can calculate time of flight of objects 0-250 m with precision. 5.9 GHz DSRC can use similar methods/principles to calculate time of flight in real time.

Figure 4:
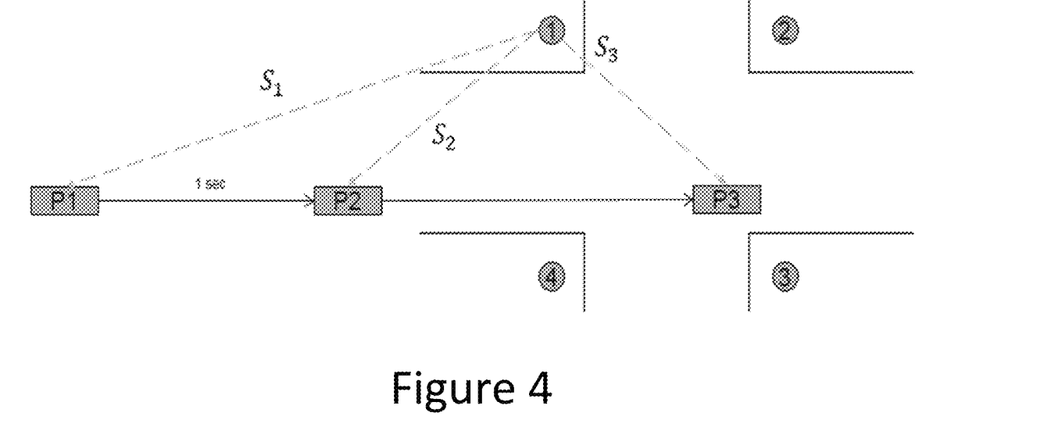
FIG. 4 depicts three samples transmitted from an RST to a moving vehicle at three separate locations at three separate times.

FIG. 4 depicts three samples transmitted from an RST to a moving vehicle at three separate locations at three separate times. The RST periodically broadcasts its fixed precise GPS coordinates+timestamp (local or UTC). The vehicle has GPS, which gives its position with some error and records its local time stamp when it receives a message from the RST. The vehicle may have high-resolution counters at the processor level to capture nanosecond time resolution.

When the vehicle is at position P1, the vehicle receives sample k−1 while the following conditions are present:
Vehicle GPS position: $V_{P1}$ (lat/long)
Vehicle Time: $V_{T1}$ (15 s)
RST Time: $R_{T1}$ (25 s)
Vehicle GPS position: $V_{P1}$ (42.703401, −83.281098)

When the vehicle is at position P2, the vehicle receives sample k while the following conditions are present:
Vehicle GPS position: $V_{P2}$
Vehicle Time: $V_{T2}$ (16.00000006 s) (calculated as 16 s+60 ns)
RST Time: $R_{T2}$ (26 s)

From these conditions and based on knowing that the vehicle speed is 10 m/s, the following vehicle model estimation may be used to calculate a distance travelled by the vehicle between receiving the current message from the RST and the previous message from the RST:

Vehicle Delta Time: $\Delta T_2 = V_{T2} - V_{T1} = 1.00000006$ s

Distance covered by vehicle in delta time:

=1.00000006 s*10 m/s=10.0000006 m≈10 m

Vehicle position as measured from GPS may be as follows.
Vehicle GPS position: $V_{P2}$ (42.703402, −83.280958)

Delta position: $V_{P2} - V_{P1} = 12$ m

When the vehicle is at position P3, the vehicle receives sample k+1 while the following conditions are present:
Vehicle GPS position: $V_{P3}$
Vehicle Time: $V_{T3}$ (17.00000016 s) (calculated as 17 s+160 ns)
RST Time: $R_{T3}$ (27 s)

From these conditions and based on knowing that the vehicle speed is 10 m/s, the following vehicle model estimation may be used to calculate a distance travelled by the vehicle between receiving the current message from the RST and the previous message from the RST:

Vehicle Delta Time: $\Delta T_3 = V_{T3} - V_{T2} = 100.000010$ ms

Distance covered by vehicle in delta time:

=1.0000001*10=10.000001 m≈10 m

This means that, in this example, as was the case at position P2, the vehicle model estimation provides a calculated estimated vehicle speed of approximately 10 m/s.

Vehicle position as measured from GPS may be as follows.

Vehicle GPS position: $V_{P3}$ (42.703402, −83.280958)

Delta position: $V_{P3}-V_{P2}$=10.5 m

Figure 5:
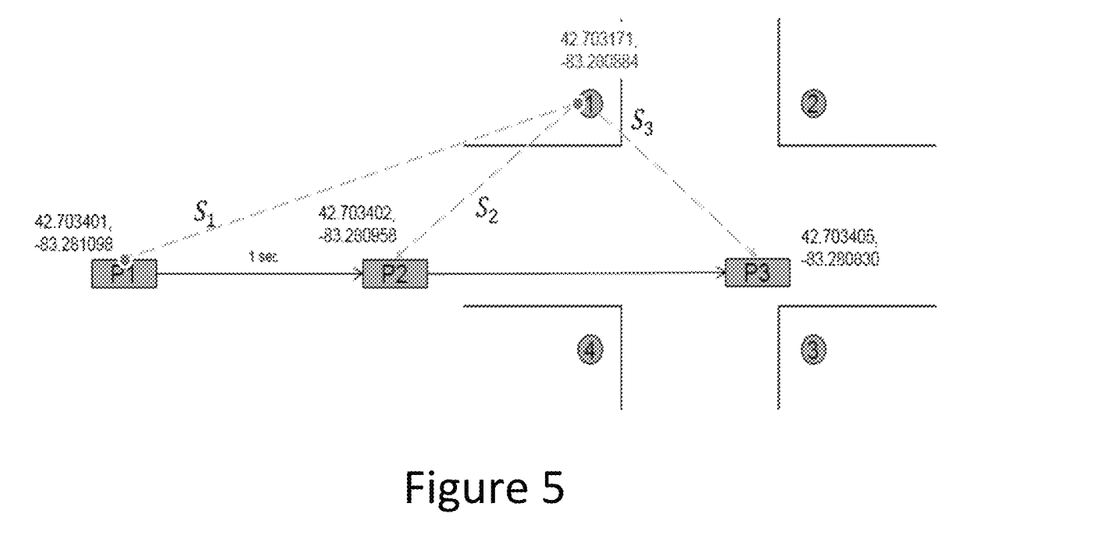
FIG. 5 is similar to FIG. 4 in that it depicts three samples transmitted from an RST to a moving vehicle at three separate locations at three separate times.

FIG. 5 is similar to FIG. 4 in that it depicts three samples transmitted from an RST to a moving vehicle at three separate locations at three separate times. The RST periodically broadcasts its fixed precise GPS coordinates+timestamp (local or UTC). The vehicle has GPS, which gives its position with some error and records its local time stamp when it receives a message from the RST. The vehicle may have high-resolution counters at the processor level to capture nanosecond time resolution.

In the example of FIG. 5, when the vehicle is at position P1, the vehicle receives sample k−1 while the following conditions are present:
Vehicle GPS position: $V_{P1}$
Vehicle Time: $V_{T1}$ (15 s)
RST position: $R_P$
RST Time: $R_{T1}$ (25 s)
Distance between RST and Vehicle:

$S_1=V_{P1}-R_P$=30.7 m

According to a model estimation in accordance with embodiments of the invention:

Delta Time: $\Delta T_1=|V_{T1}-R_{T1}|$

=10 s

When the vehicle is at position P2, the vehicle receives sample k while the following conditions are present:
Vehicle GPS position: $V_{P2}$
Vehicle Time: $V_{T2}$ (16.00000001 s)

16 s+10 ns

RST position: $R_P$
RST Time: $R_{T2}$ (26 s)
Distance between RST and Vehicle (m):

$S_2=V_{P2}-R_P$=27.5 m $S_2-S_1$=3.2 m

According to a model estimation in accordance with embodiments of the invention:

Delta Time: $\Delta T_2=|V_{T2}-R_{T2}|$

=10.00000001 s

Difference of delta time:

$\Delta T_2-\Delta T_1$=10 ns=10×10$^{-9}$ s

Distance propagated by DSRC signal in that time:

10×10$^{-9}$*3×10$^8$=3 m

⇒$S_2-S_1$=3 m

When the vehicle is at position P3, the vehicle receives sample k+1 while the following conditions are present:
Vehicle GPS position: $V_{P3}$
Vehicle Time: $V_{T3}$ (17.000000011 s)

17 s+11 ns

RST position: $R_P$
RST Time: $R_{T2}$ (27 s)
Distance between RST and Vehicle:

$S_3=V_{P2}-R_P$=26.5 m $S_3-S_2$=1 m

According to a model estimation in accordance with embodiments of the invention:

Delta Time: $\Delta T_3=V_{T3}-R_{T3}$

=10.000000011 s

Difference of delta time:

$\Delta T_3-\Delta T_2$=1 ns=1×10$^{-9}$ s

Distance propagated by DSRC signal in that time:

1×10$^{-9}$*3×10$^8$=0.3 m

⇒$S_3-S_2$=0.3 m

With more measurements from different RSTs, an estimation model will have more data to reduce the error in the position estimation faster.

Combining vehicle motion with GPS position with near constant (or constant) error helps to produce better position estimates. There are many different suitable estimation methods. The most common is Kalman Filter (KF). In the field of robotics and automated driving, people widely use KF, or one its variants, to use GPS and vehicle motion information for dead-reckoning or for localization (better position estimates). A significant feature of KF is it can take in noisy/erroneous measurements and still be able to provide better state estimates. It considers the measurements to have Gaussian error (white noise) and thereby can calculate variances and covariances of said measurements and states. This helps in better state estimates.

Kalman filtering, also known as linear quadratic estimation (LQE), is an algorithm that uses a series of measurements observed over time, containing statistical noise and other inaccuracies, and produces estimates of unknown variables that tend to be more accurate than those based on a single measurement alone, by estimating a joint probability distribution over the variables for each timeframe.

In urban environments (with high rise buildings around), GPS signals may not be available or may have bigger error. In such cases any additional measurement (such as DSRC from RST) will help a lot in obtaining better position estimates.

Measurement inputs for Kalman Filter or similar estimation approaches (at each sample) may include: Vehicle GPS location at each sample measurements; Vehicle motion in the form of speed, yaw rate and accelerations→how much vehicle moved in the sample time; comparison of measurements with position estimates from the vehicle motion model where vehicle would be at each sample; and update gains to reduce position estimate error.

Additional inputs from DSRC messages from RSTs in accordance with embodiments of the invention may include: how long it takes for DSRC signal from one or more fixed RSTs to reach the vehicle; and comparison of that information with vehicle position estimates from a signal propagation model, which is based on how long it takes a DSRC signal to reach vehicle GPS location from fixed a RST location.

With asynchronous time at RST and vehicle, delta time is compared to receive a message from the RST over measurement samples. This indicates how much longer (or shorter) it takes to receive RST message compared to the previous sample. This gives an idea how far the vehicle has moved over a sample from a fixed RST location.

With time synchronous between RST and Vehicle, per sample, a delta time to receive a message at the vehicle can be calculated (time stamp from vehicle−RST). This indicates how much longer (or shorter) it takes to receive the RST message compared to the previous sample. This gives an idea how far the vehicle has moved over a sample relative to a fixed RST location.

Figure 6:
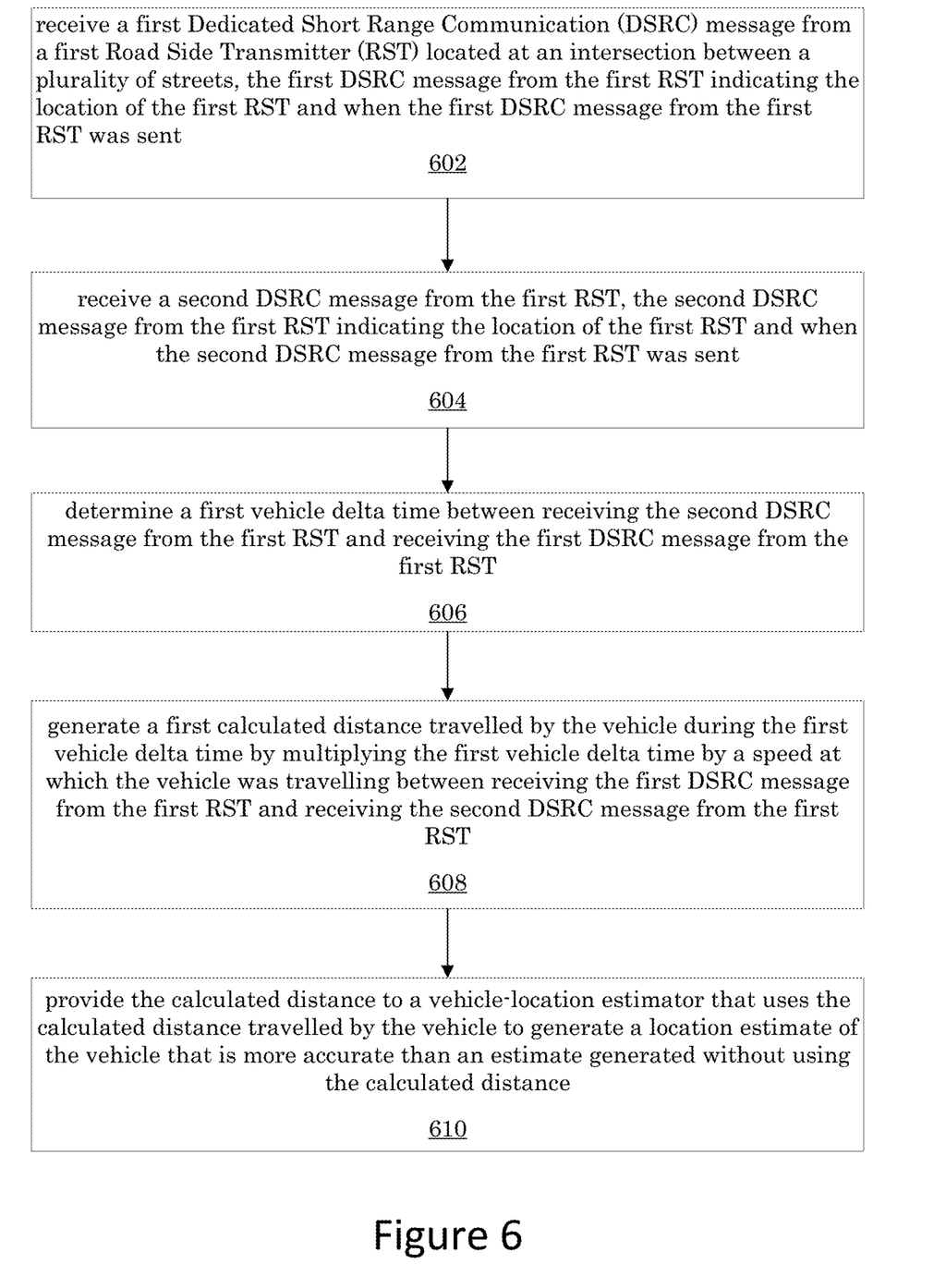
FIG. 6 is a flow chart that depicts operations performed by a processor for improving a vehicle's location estimate in accordance with embodiments of the invention.

FIG. 6 is a flow chart that depicts operations performed by a processor for improving a vehicle's location estimate in accordance with embodiments of the invention. At 602, a first Dedicated Short Range Communication (DSRC) message is received from a first Road Side Transmitter (RST) located at an intersection between a plurality of streets, the first DSRC message from the first RST indicating the location of the first RST and when the first DSRC message from the first RST was sent. At 604, a second DSRC message is received from the first RST, the second DSRC message from the first RST indicating the location of the first RST and when the second DSRC message from the first RST was sent. At 606, a first vehicle delta time between receiving the second DSRC message from the first RST and receiving the first DSRC message from the first RST is determined. At 608, a first calculated distance travelled by the vehicle during the first vehicle delta time is generated by multiplying the first vehicle delta time by a speed at which the vehicle was travelling between receiving the first DSRC message from the first RST and receiving the second DSRC message from the first RST. And, at 610, the calculated distance is provided to a vehicle-location estimator that uses the calculated distance travelled by the vehicle to generate a location estimate of the vehicle that is more accurate than an estimate generated without using the calculated distance.

Figure 7:
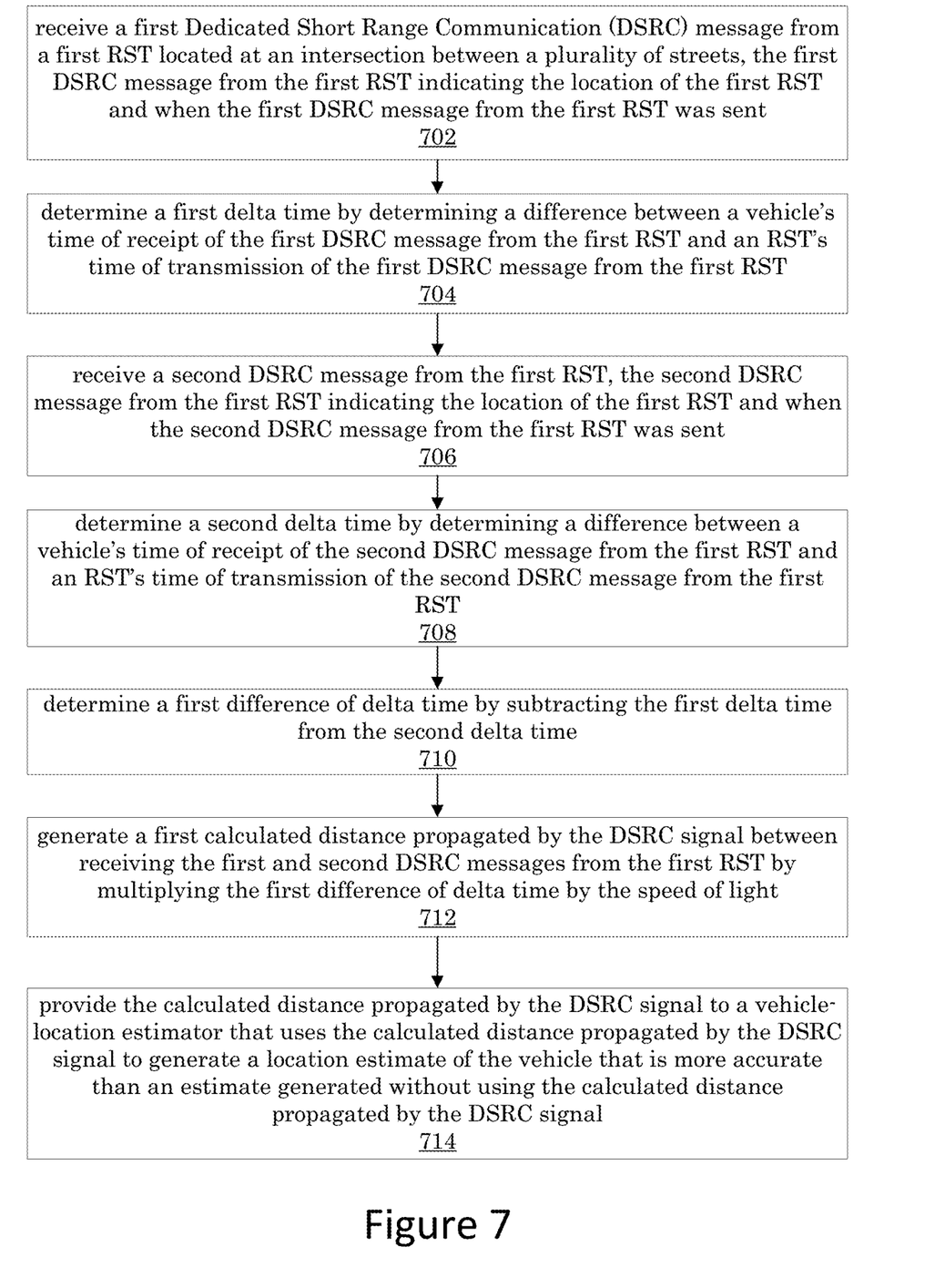
FIG. 7 is a flow chart that depicts operations performed by a processor for improving a vehicle's location estimate in accordance with embodiments of the invention.

FIG. 7 is a flow chart that depicts operations performed by a processor for improving a vehicle's location estimate in accordance with embodiments of the invention. At 702, a first Dedicated Short Range Communication (DSRC) message is received from a first RST located at an intersection between a plurality of streets, the first DSRC message from the first RST indicating the location of the first RST and when the first DSRC message from the first RST was sent. At 704, a first delta time is determined by determining a difference between a vehicle's time of receipt of the first DSRC message from the first RST and an RST's time of transmission of the first DSRC message from the first RST. At 706, a second DSRC message is received from the first RST, the second DSRC message from the first RST indicating the location of the first RST and when the second DSRC message from the first RST was sent. At 708, a second delta time is determined by determining a difference between a vehicle's time of receipt of the second DSRC message from the first RST and an RST's time of transmission of the second DSRC message from the first RST. At 710, a first difference of delta time is determined by subtracting the first delta time from the second delta time. At 712, a first calculated distance propagated by the DSRC signal between receiving the first and second DSRC messages from the first RST is determined by multiplying the first difference of delta time by the speed of light. And, at 714, the calculated distance propagated by the DSRC signal is provided to a vehicle-location estimator that uses the calculated distance propagated by the DSRC signal to generate a location estimate of the vehicle that is more accurate than an estimate generated without using the calculated distance propagated by the DSRC signal.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

The invention claimed is:

1. An apparatus comprising:
   a processor configured to execute computer-executable instructions stored on a non-transitory medium, wherein the computer-executable instructions, when executed, cause the processor to:
   receive a first Dedicated Short Range Communication (DSRC) message from a first Road Side Transmitter (RST) located at an intersection between a plurality of streets when a vehicle is within range of the first RST, the first DSRC message from the first RST indicating the location of the first RST and when the first DSRC message from the first RST was sent;
   receive a second DSRC message through the receiver from the first RST when the vehicle is within range of the first RST, the second DSRC message from the first RST indicating the location of the first RST and when the second DSRC message from the first RST was sent;
   determine a first vehicle delta time between receiving the second DSRC message from the first RST and receiving the first DSRC message from the first RST;
   generate a first calculated distance traveled by the vehicle during the first vehicle delta time by multiplying the first vehicle delta time by a speed at which the vehicle was travelling between receiving the first DSRC message from the first RST and receiving the second DSRC message from the first RST; and
   provide the calculated distance to a vehicle-location estimator that uses the calculated distance traveled by the vehicle to generate a location estimate of the vehicle that is more accurate than an estimate generated without using the calculated distance.

2. The apparatus of claim 1, further comprising computer-executable instructions that when executed, cause the processor to:
   receive a plurality of first DSRC messages from a plurality of additional RSTs located at the intersection between the plurality of streets when the vehicle is within range of the plurality of additional RSTs, the plurality of first DSRC messages from the plurality of additional RSTs indicating the respective plurality of locations of the plurality of additional RSTs and the respective times when the plurality of first DSRC messages from the plurality of additional RSTs were sent;
   receive a plurality of second DSRC messages from the plurality of additional RSTs when the vehicle is within range of the plurality of additional RSTs, the plurality of second DSRC messages from the plurality of additional RSTs indicating the respective plurality of locations of the plurality of additional RSTs and the respective times when the plurality of second DSRC messages from the plurality of additional RSTs were sent;

determine a respective plurality of additional vehicle delta times between receiving the corresponding plurality of second DSRC messages from the plurality of additional RSTs and receiving the corresponding plurality of first DSRC messages from the plurality of additional RSTs;

generate an average calculated distance traveled by the vehicle during the vehicle delta time by multiplying an average of the first vehicle delta time and the plurality of additional vehicle delta times by a speed at which the vehicle was travelling between receiving the first DSRC messages from the first RST and the plurality of additional RSTs and receiving the second DSRC messages from the second RST and the plurality of additional RSTs; and provide the average calculated distance to a vehicle-location estimator that uses the average calculated distance traveled by the vehicle to generate a location estimate of the vehicle that is more accurate than an estimate generated without using the average calculated distance.

3. The apparatus of claim 2, further comprising computer-executable instructions that, when executed, cause the processor to:

receive from the first RST a GPS correction message indicating a GPS error that the first RST has determined by comparing a known location of the first RST and a location of the first RST determined via a GPS receiver at the first RST; and provide the GPS error received from the first RST to the vehicle-location estimator that uses the GPS error received from the first RST to generate a location estimate of the vehicle that is more accurate than an estimate generated without using the GPS error received from the first RST.

4. The apparatus of claim 3, further comprising computer-executable instructions that, when executed, cause the processor to:

receive from the plurality of additional RSTs a corresponding plurality of GPS correction messages indicating a corresponding plurality of GPS errors that the plurality of additional RSTs have determined by comparing a plurality of respective known locations of the plurality of additional RSTs and a plurality of corresponding locations of the plurality of additional RSTs determined via a corresponding plurality of GPS receivers at the plurality of additional RSTs;

generate an average GPS error by calculating an average of the GPS errors received from the first RST and from the plurality of additional RSTs; and provide the average GPS error received from the first RST and the plurality of additional RSTs to the vehicle-location estimator that uses the average GPS error to generate a location estimate of the vehicle that is more accurate than an estimate generated without using the average GPS error.

5. The apparatus of claim 1, further comprising computer-executable instructions that, when executed, cause the processor to:

receive from the first RST a GPS correction message indicating a GPS error that the first RST has determined by comparing a known location of the first RST and a location of the first RST determined via a GPS receiver at the first RST; and provide the GPS error received from the first RST to the vehicle-location estimator that uses the GPS error received from the first RST to generate a location estimate of the vehicle that is more accurate than an estimate generated without using the GPS error received from the first RST.

6. An apparatus comprising:

a processor configured to execute computer-executable instructions stored on a non-transitory medium, wherein the computer-executable instructions, when executed, cause the processor to:

receive a first Dedicated Short Range Communication (DSRC) message from a first RST located at an intersection between a plurality of streets when a vehicle is within range of the first RST, the first DSRC message from the first RST indicating the location of the first RST and when the first DSRC message from the first RST was sent;

determine a first delta time by determining a difference between a vehicle's time of receipt of the first DSRC message from the first RST and an RST's time of transmission of the first DSRC message from the first RST;

receive a second DSRC message from the first RST when the vehicle is within range of the first RST, the second DSRC message from the first RST indicating the location of the first RST and when the second DSRC message from the first RST was sent;

determine a second delta time by determining a difference between a vehicle's time of receipt of the second DSRC message from the first RST and an RST's time of transmission of the second DSRC message from the first RST;

determine a first difference of delta time by subtracting the first delta time from the second delta time;

generate a first calculated distance propagated by the DSRC signal between receiving the first and second DSRC messages from the first RST by multiplying the first difference of delta time by the speed of light; and provide the calculated distance propagated by the DSRC signal to a vehicle-location estimator that uses the calculated distance propagated by the DSRC signal to generate a location estimate of the vehicle that is more accurate than an estimate generated without using the calculated distance propagated by the DSRC signal.

7. The apparatus of claim 6, further comprising computer-executable instructions that, when executed, cause the processor to:

receive a plurality of additional first DSRC messages from a plurality of additional RSTs when the vehicle is within range of the plurality of additional RSTs, the plurality of first DSRC messages from the plurality of additional RSTs indicating the respective plurality of locations of the plurality of additional RSTs and when the plurality of first DSRC messages from the plurality of additional RSTs were sent;

determine a plurality of additional first delta times by determining a plurality of respective differences between the vehicle's respective times of receipt of the plurality of additional first DSRC messages from the plurality of additional RSTs and the plurality of RST's corresponding plurality of times of transmission of the plurality of first DSRC messages from the additional plurality of RSTs;

receive a plurality of additional second DSRC messages from the plurality of additional RSTs when the vehicle is within range of the plurality of additional RSTs, the plurality of second DSRC messages from the plurality of additional RSTs indicating the respective locations of the plurality of additional RSTs and when the plurality of second DSRC messages from the plurality of additional RSTs were sent;

determine a plurality of additional second delta times by determining a plurality of respective differences between the vehicle's respective times of receipt of the plurality of additional second DSRC messages from the plurality of additional RSTs and the plurality of RST's corresponding plurality of times of transmission of the plurality of second DSRC messages from the additional plurality of RSTs;

determine a plurality of additional differences of delta times by subtracting the plurality of additional first delta times from the plurality of additional second delta times;

generate a plurality of additional calculated distances propagated by the DSRC signal between receiving the plurality of additional first and plurality of additional second DSRC messages from the plurality of additional RSTs by multiplying respective ones of the additional differences of delta time by the speed of light;

generate a calculated average distance propagated by the DSRC signal by calculating an average of the first calculated distance propagated by the DSRC signal between receiving the first and second DSRC messages from the first RST and the plurality of additional calculated distances between receiving the plurality of additional first and plurality of additional second DSRC messages from the plurality of additional RSTs; and provide the calculated average distance propagated by the DSRC signal to a vehicle-location estimator that uses the calculated average distance propagated by the DSRC signal to generate a location estimate of the vehicle that is more accurate than an estimate generated without using the calculated average distance propagated by the DSRC signal.

8. The apparatus of claim 7, further comprising computer-executable instructions that, when executed, cause the processor to:

receive from the first RST a GPS correction message indicating a GPS error that the first RST has determined by comparing a known location of the first RST and a location of the first RST determined via a GPS receiver at the first RST; and provide the GPS error received from the first RST to the vehicle-location estimator that uses the GPS error received from the first RST to generate a location estimate of the vehicle that is more accurate than an estimate generated without using the GPS error received from the first RST.

9. The apparatus of claim 8, further comprising computer-executable instructions that, when executed, cause the processor to:

receive from the plurality of additional RSTs a corresponding plurality of GPS correction messages indicating a corresponding plurality of GPS errors that the plurality of additional RSTs has determined by comparing a plurality of respective known location of the plurality of additional RSTs and a plurality of corresponding locations of the plurality of additional RSTs determined via a corresponding plurality of GPS receivers at the plurality of additional RSTs;

generate an average GPS error by calculating an average of the GPS errors received from the first RST and from the plurality of additional RSTs; and provide the average GPS error received from the first RST and the plurality of additional RSTs to the vehicle-location estimator that uses the average GPS error to generate a location estimate of the vehicle that is more accurate than an estimate generated without using the average GPS error.

10. The apparatus of claim 6, further comprising computer-executable instructions that, when executed, cause the processor to:

receive from the first RST a GPS correction message indicating a GPS error that the first RST has determined by comparing a known location of the first RST and a location of the first RST determined via a GPS receiver at the first RST; and provide the GPS error received from the first RST to the vehicle-location estimator that uses the GPS error received from the first RST to generate a location estimate of the vehicle that is more accurate than an estimate generated without using the GPS error received from the first RST.

\* \* \* \* \*